United States Patent
Kim

(10) Patent No.: US 10,790,834 B2
(45) Date of Patent: Sep. 29, 2020

(54) SEMICONDUCTOR DEVICE

(71) Applicant: SK hynix Inc., Icheon-si Gyeonggi-do (KR)

(72) Inventor: Jayoung Kim, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/199,060

(22) Filed: Nov. 23, 2018

(65) Prior Publication Data

US 2019/0386666 A1    Dec. 19, 2019

(30) Foreign Application Priority Data

Jun. 14, 2018  (KR) .......................... 10-2018-0068349

(51) Int. Cl.
| | | |
|---|---|---|
| *H03L 7/08* | (2006.01) | |
| *H03K 5/133* | (2014.01) | |
| *H03L 7/081* | (2006.01) | |
| *H03K 5/00* | (2006.01) | |

(52) U.S. Cl.
CPC .......... *H03L 7/0812* (2013.01); *H03K 5/133* (2013.01); *H03K 2005/00019* (2013.01); *H03K 2005/00241* (2013.01)

(58) Field of Classification Search
CPC .................. H03L 7/0812; H03K 3/133; H03K 2005/00019; H03K 2005/00241
See application file for complete search history.

(56) References Cited

U.S. PATENT DOCUMENTS

| | | | |
|---|---|---|---|
| 7,830,194 B2 * | 11/2010 | Lin ....................... | H03L 7/0816 327/291 |
| 8,089,308 B2 | 1/2012 | Yoshizawa et al. | |
| 10,305,494 B2 * | 5/2019 | Lee ........................ | H03K 19/20 |

FOREIGN PATENT DOCUMENTS

KR    1020120063137 A    6/2012

OTHER PUBLICATIONS

May 26, 2020.

* cited by examiner

*Primary Examiner* — Dinh T Le
(74) *Attorney, Agent, or Firm* — William Park & Associates Ltd.

(57) ABSTRACT

A semiconductor device includes a delay code generation circuit configured to adjust a shifting code for delaying a first internal clock, by comparing phases of a second internal clock and a delayed clock, the delayed clock generated by delaying the first internal clock, and configured to generate a first delay code and a second delay code from the shifting code.

16 Claims, 16 Drawing Sheets

FIG.5

| SC<1> | SC<2> | SC<3> | ... | SC<N> | DELAY INTERVAL |
|---|---|---|---|---|---|
| 1 | 0 | 0 | ... | 0 | NUI |
| 0 | 1 | 0 | ... | 0 | (N-1)UI |
| 0 | 0 | 1 | ... | 0 | (N-2)UI |
| ⋮ | ⋮ | ⋮ | ... | ⋮ | ⋮ |
| 0 | 0 | 0 | ... | 1 | UI | ered
SEMICONDUCTOR DEVICE

CROSS-REFERENCE TO RELATED APPLICATION

The present application claims priority under 35 U.S.C. § 119(a) to Korean Patent Application No. 10-2018-0068349 filed on Jun. 14, 2018 in the Korean Intellectual Property Office, which is incorporated herein by reference in its entirety.

BACKGROUND

1. Technical Field

Embodiments of the present disclosure generally relate to a semiconductor device, and more particularly, to a semiconductor device relating to delay codes.

2. Related Art

A semiconductor device may secure a delay interval necessary for an internal operation, by using various delay circuits. The semiconductor device may perform a second internal operation when a delay interval secured by a delay circuit has elapsed after performing a first internal operation.

Meanwhile, the semiconductor device stores an information on a latency, in a mode register, through a mode register set operation. The latency includes informations on various delay intervals necessary when various internal operations, for example, a read operation and a write operation, of the semiconductor device are performed. The semiconductor device may use a delay circuit to secure a delay interval set by the latency.

SUMMARY

In an embodiment, a semiconductor device may include a delay code generation circuit configured to adjust a shifting code for delaying a first internal clock, by comparing phases of a second internal clock and a delayed clock, the delayed clock generated by delaying the first internal clock, and configured to generate a first delay code and a second delay code from the shifting code.

In an embodiment, a semiconductor device may include a delayed clock generation circuit configured to generate a delayed clock by delaying a first internal clock by a delay internal that is adjusted by a shifting code; a phase detection circuit configured to generate a detection signal by comparing phases of the delayed clock and a second internal clock; a shifting control signal generation circuit configured to generate first to third shifting control signals for adjusting the shifting code, based on the first internal clock and the detection signal; and a code latch circuit configured to generate a first delay code and a second delay code from the shifting code based on the first to third shifting control signals.

In an embodiment, a delay code generation circuit may include a delayed clock generation circuit configured to generate a delayed clock by delaying a first internal clock by a delay internal that is adjusted by a shifting code; a phase detection circuit configured to generate a detection signal by comparing phases of the delayed clock and a second internal clock; a shifting control signal generation circuit configured to generate first to third shifting control signals for adjusting the shifting code, based on the first internal clock and the detection signal; and a code latch circuit configured to generate a first delay code and a second delay code from the shifting code based on the first to third shifting control signals.

BRIEF DESCRIPTION OF THE DRAWINGS

FIG. 5 is a representation of an example of a table to assist in the explanation of the operation of the delayed clock generation circuit illustrated in FIG. 4.

DETAILED DESCRIPTION

Hereinafter, a semiconductor device will be described below with reference to the accompanying drawings through various examples of embodiments.

According to various embodiments, by adjusting a delay interval of a delay circuit through using a first delay code generated when a phase of a delayed clock is earlier than a phase of an internal clock and a second delay code generated when a phase of the delayed clock is later than a phase of the internal clock, an error of a delay interval set by the first delay code and an error of a delay interval set by the second delay code which occur due to a variation in PVT (process, voltage and temperature) may be offset with each other. As a consequence, even when a variation occurs in PVT, an error of the delay interval set in the delay circuit may be decreased.

Various embodiments may be directed to a semiconductor device relating to delay codes.

Figure 1:
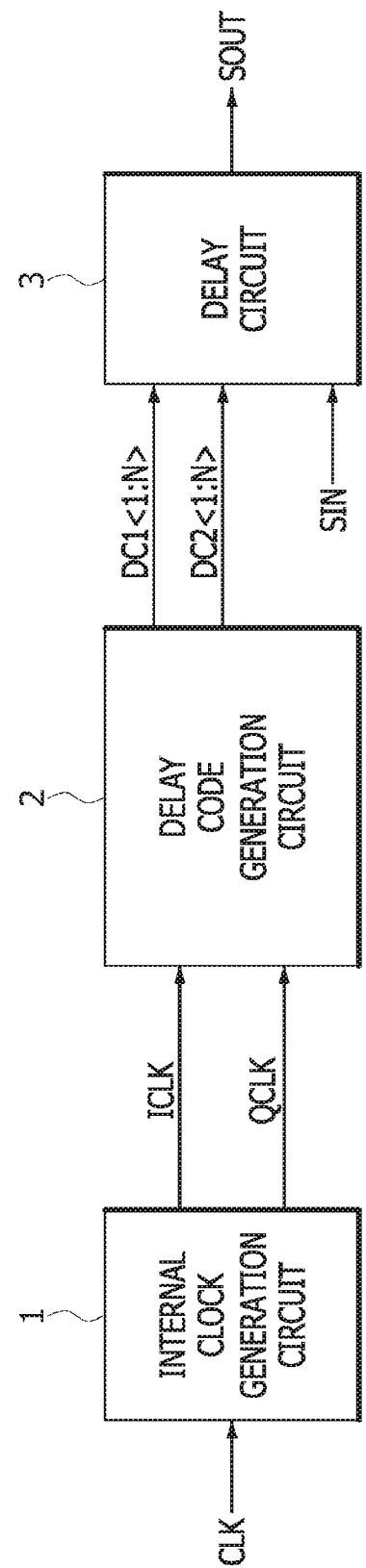
FIG. 1 is a block diagram illustrating a representation of an example of the configuration of a semiconductor device in accordance with an embodiment.

As illustrated in FIG. 1, a semiconductor device in accordance with an embodiment may include an internal clock generation circuit 1, a delay code generation circuit 2 and a delay circuit 3.

The internal clock generation circuit 1 may divide a clock CLK and generate a first internal clock ICLK and a second internal clock QCLK. The cycle of the first internal clock ICLK and the second internal clock QCLK may be set to N times the cycle of the clock CLK. N may be set to a natural number. In the present embodiment, N may be set to 2. The second internal clock QCLK may be set to have a phase later by 90 degrees than the first internal clock ICLK. The second internal clock QCLK may be generated by delaying the first internal clock ICLK by the half cycle of the clock CLK. The operation of the internal clock generation circuit 1 will be described later with reference to FIG. 2.

The delay code generation circuit 2 may generate a first delay code DC1<1:N> and a second delay code DC2<1:N> based on the first internal clock ICLK and the second internal clock QCLK. The delay code generation circuit 2 may generate the first delay code DC1<1:N> and the second delay code DC2<1:N> from a shifting code SC<1:N> (see FIG. 3) for adjusting a delay interval by which the first internal clock ICLK is delayed, depending on a result of comparing a delayed clock ICLKd (see FIG. 3) generated by delaying the first internal clock ICLK, with the second internal clock QCLK. The delay code generation circuit 2 may adjust the shifting code SC<1:N> to increase a delay interval of the first internal clock ICLK when the phase of the delayed clock ICLKd is earlier than the phase of the second internal clock QCLK, and may output the shifting code SC<1:N> as the first delay code DC1<1:N>. The delay code generation circuit 2 may adjust the shifting code SC<1:N> to decrease a delay interval of the first internal clock ICLK when the phase of the delayed clock ICLKd is later than the phase of the second internal clock QCLK, and may output the shifting code SC<1:N> as the second delay code DC2<1:N>. The configuration and operation of the delay code generation circuit 2 will be described later with reference to FIGS. 3 to 13.

The delay circuit 3 may delay an input signal SIN by a delay interval set by the first delay code DC1<1:N> and the second delay code DC2<1:N>, and generate an output signal SOUT. The delay circuit 3 may include a first delay 31 (see FIG. 14) which is adjusted in its delay interval by the first delay code DC1<1:N> and a second delay 32 (see FIG. 14) which is adjusted in its delay interval by the second delay code DC2<1:N>. The configuration and operation of the delay circuit 3 will be described later with reference to FIGS. 14 to 16.

Figure 2:
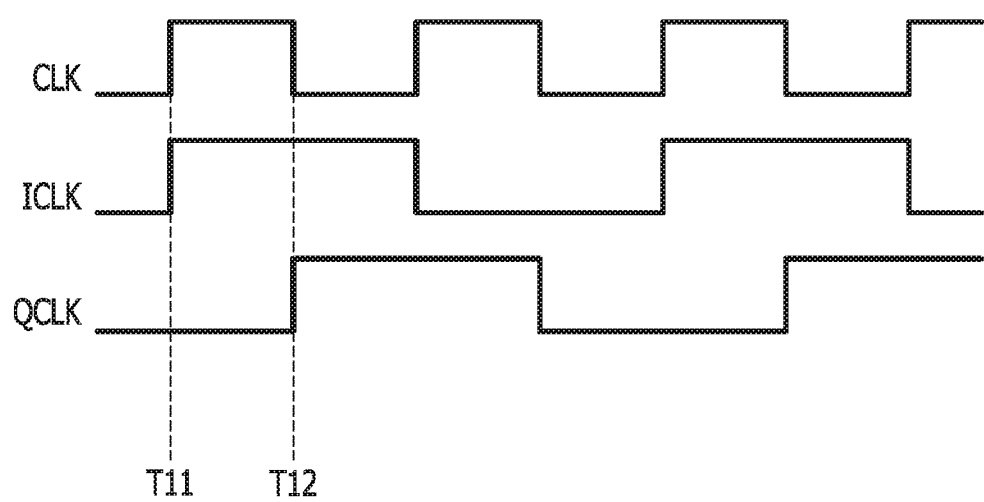
FIG. 2 is a representation of an example of a timing diagram to assist in the explanation of the operation of the internal clock generation circuit included in the semiconductor device illustrated in FIG. 1.

Referring to FIG. 2, the waveforms of the first internal clock ICLK and the second internal clock QCLK which are generated by dividing the clock CLK may be seen. The cycle of the first internal clock ICLK and the second internal clock QCLK is set to two times the cycle of the clock CLK. The second internal clock QCLK may be set to have a phase later by 90 degrees than the first internal clock ICLK. Therefore, the second internal clock QCLK is generated at a time T12 that is delayed by the half cycle of the clock CLK from a time T11 at which the first internal clock ICLK is generated.

Figure 3:
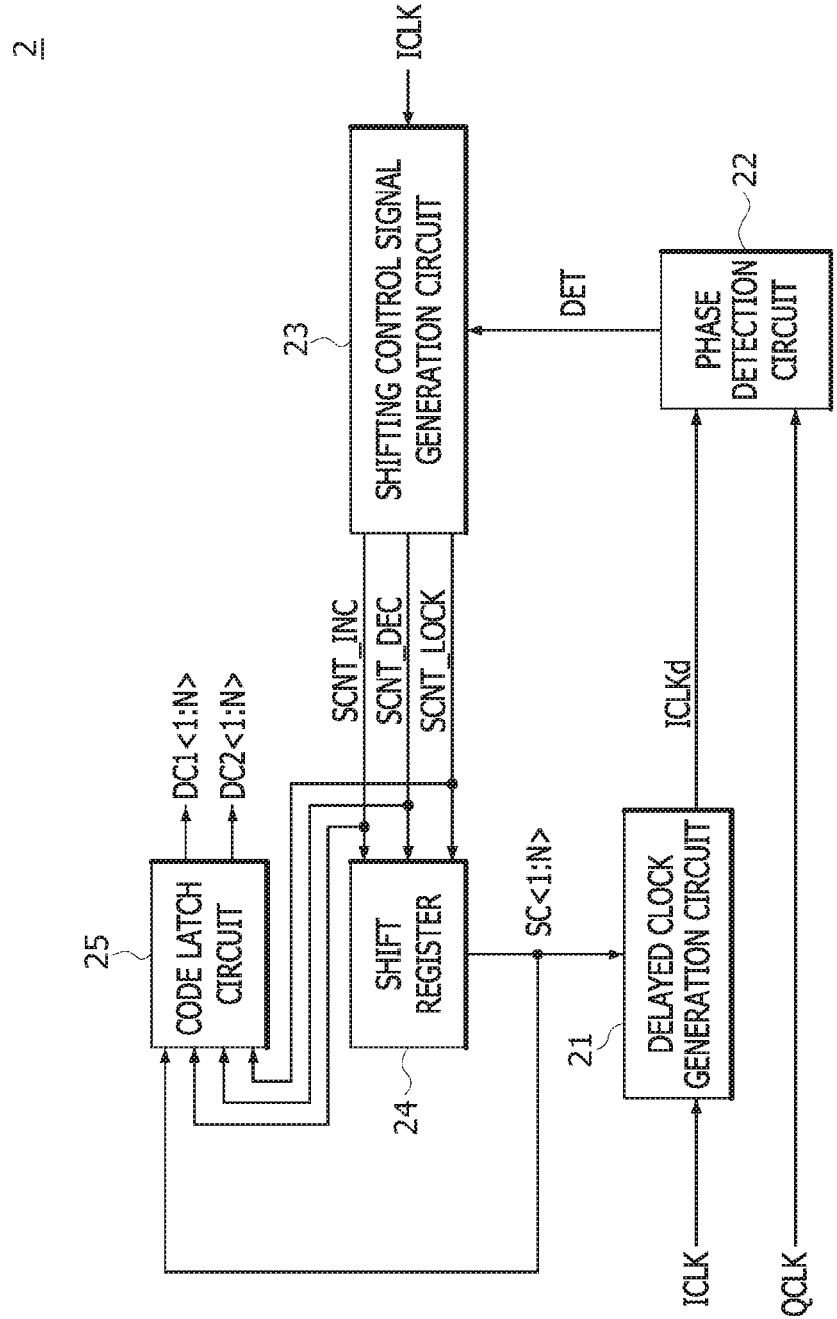
FIG. 3 is a block diagram illustrating a representation of an example of the configuration of the delay code generation circuit included in the semiconductor device illustrated in FIG. 1.

Referring to FIG. 3, the delay code generation circuit 2 may include a delayed clock generation circuit 21, a phase detection circuit 22, a shifting control signal generation circuit 23, a shift register 24 and a code latch circuit 25.

The delayed clock generation circuit 21 may delay the first internal clock ICLK by a delay interval that is set by the shifting code SC<1:N>, and thereby generate the delayed clock ICLKd. The shifting code SC<1:N> may be adjusted to increase the delay interval of the delayed clock generation circuit 21 when the phase of the delayed clock ICLKd is earlier than the phase of the second internal clock QCLK. The shifting code SC<1:N> may be adjusted to decrease the delay interval of the delayed clock generation circuit 21 when the phase of the delayed clock ICLKd is later than the phase of the second internal clock QCLK. The configuration and operation of the delayed clock generation circuit 21 will be described later with reference to FIGS. 4 and 5.

The phase detection circuit 22 may compare the phases of the delayed clock ICLKd and the second internal clock QCLK, and thereby generate a detection signal DET. The phase detection circuit 22 may generate the detection signal DET which has a first logic level when the phase of the delayed clock ICLKd is earlier than the phase of the second internal clock QCLK. The phase detection circuit 22 may generate the detection signal DET which has a second logic level when the phase of the delayed clock ICLKd is later than the phase of the second internal clock QCLK. The first logic level and the second logic level may be set variously depending on an embodiment. The configuration and operation of the phase detection circuit 22 will be described later with reference to FIGS. 6 and 7.

The shifting control signal generation circuit 23 may generate a first shifting control signal SCNT_INC, a second shifting control signal SCNT_DEC and a third shifting control signal SCNT_LOCK based on the first internal clock ICLK and the detection signal DET. The shifting control signal generation circuit 23 may generate the first shifting control signal SCNT_INC and the second shifting control signal SCNT_DEC which are selectively enabled depending on the logic level of the detection signal DET, in synchronization with a divided clock ICLKV (see FIG. 8) which is generated by dividing the first internal clock ICLK. The shifting control signal generation circuit 23 may generate the third shifting control signal SCNT_LOCK which is enabled at a time when the first shifting control signal SCNT_INC and the second shifting control signal SCNT_DEC are respectively enabled at least one time. The configuration and operation of the shifting control signal generation circuit 23 will be described later with reference to FIGS. 8 to 10.

The shift register 24 may adjust the shifting code SC<1:N> based on the first shifting control signal SCNT_INC, the second shifting control signal SCNT_DEC and the third shifting control signal SCNT_LOCK. The shift register 24 may adjust the shifting code SC<1:N> to increase the delay interval of the delayed clock generation circuit 21 when the first shifting control signal SCNT_INC is enabled. The shift register 24 may adjust the shifting code SC<1:N> to decrease the delay interval of the delayed clock generation circuit 21, when the second shifting control signal SCNT_DEC is enabled. The shift register 24 may lock the logic level combination of the shifting code SC<1:N> to lock the delay interval of the delayed clock generation circuit 21, when the third shifting control signal SCNT_LOCK is enabled.

The code latch circuit 25 may generate the first delay code DC1<1:N> and the second delay code DC2<1:N> from the shifting code SC<1:N> based on the first shifting control signal SCNT_INC, the second shifting control signal SCNT_DEC and the third shifting control signal SCNT_LOCK. The code latch circuit 25 may generate the first delay code DC1<1:N> from the shifting code SC<1:N> when the third shifting control signal SCNT_LOCK is enabled and the first shifting control signal SCNT_INC is enabled. The code latch circuit 25 may generate the second delay code DC2<1:N> from the shifting code SC<1:N> when the third shifting control signal SCNT_LOCK is enabled and the second shifting control signal SCNT_DEC is enabled. The configuration and operation of the code latch circuit 25 will be described later with reference to FIGS. 11 to 13.

Figure 4:
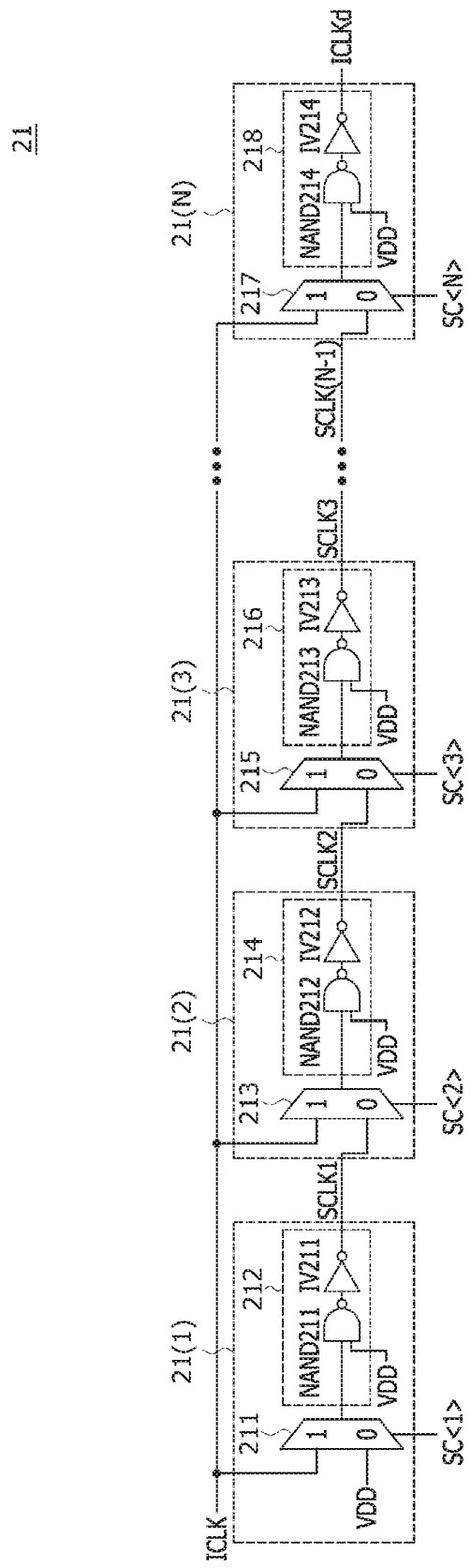
FIG. 4 is a circuit diagram illustrating a representation of an example of the delayed clock generation circuit included in the delay code generation circuit illustrated in FIG. 3.

Referring to FIG. 4, the delayed clock generation circuit 21 may include first to N^th clock unit delays 21(1:N).

The first clock unit delay 21(1) may include a first clock selector 211 and a first clock outputter 212. The first clock selector 211 may selectively output the first internal clock ICLK or a power supply voltage VDD based on the first bit SC<1> of the shifting code SC<1:N>. The first clock outputter 212 may be configured to perform a NAND operation and an inversion operation. For example, the first clock outputter 212 may include a NAND gate NAND211 and an inverter IV211. The NAND gate NAND211 may receive the output signal of the first clock selector 211 and the power supply voltage VDD and perform a NAND logic operation. The inverter IV211 may invert and buffer the output signal of the NAND gate NAND211, and output a first shifting clock SCLK1. The first clock outputter 212 may buffer the output signal of the first clock selector 211 and generate the first shifting clock SCLK1.

The second clock unit delay 21(2) may include a second clock selector 213 and a second clock outputter 214. The second clock selector 213 may selectively output the first internal clock ICLK or the first shifting clock SCLK1 based on the second bit SC<2> of the shifting code SC<1:N>. The second clock outputter 214 may be configured to perform a NAND operation and an inversion operation. For example, the second clock outputter 214 may include a NAND gate NAND212 and an inverter IV212. The NAND gate NAND212 may receive the output signal of the second clock selector 213 and the power supply voltage VDD and perform a NAND logic operation. The inverter IV212 may invert and buffer the output signal of the NAND gate NAND212, and output a second shifting clock SCLK2. The second clock outputter 214 may buffer the output signal of the second clock selector 213 and generate the second shifting clock SCLK2.

The third clock unit delay 21(3) may include a third clock selector 215 and a third clock outputter 216. The third clock selector 215 may selectively output the first internal clock ICLK or the second shifting clock SCLK2 based on the third bit SC<3> of the shifting code SC<1:N>. The third clock outputter 216 may be configured to perform a NAND operation and an inversion operation. For example, the third clock outputter 216 may include a NAND gate NAND213 and an inverter IV213. The NAND gate NAND213 may receive the output signal of the third clock selector 215 and the power supply voltage VDD and perform a NAND logic operation. The inverter IV213 may invert and buffer the output signal of the NAND gate NAND213, and output a third shifting clock SCLK3. The third clock outputter 216 may buffer the output signal of the third clock selector 215 and generate the third shifting clock SCLK3.

The N^th clock unit delay 21(N) may include an N^th clock selector 217 and an N^th clock outputter 218. The N^th clock selector 217 may selectively output the first internal clock ICLK or an (N−1)^th shifting clock SCLK(N−1) based on the N^th bit SC<N> of the shifting code SC<1:N>. The N^th clock outputter 218 may be configured to perform a NAND operation and an inversion operation. For example, the N^th clock outputter 218 may include a NAND gate NAND214 and an inverter IV214. The NAND gate NAND214 may receive the output signal of the N^th clock selector 217 and the power supply voltage VDD and perform a NAND logic operation. The inverter IV214 may invert and buffer the output signal of the NAND gate NAND214, and output the delayed clock ICLKd. The N^th clock outputter 218 may buffer the output signal of the N^th clock selector 217 and generate the delayed clock ICLKd.

When the first bit SC<1> of the shifting code SC<1:N> is logic high level and the second to N^th bits SC<2:N> of the shifting code SC<1:N> are logic low level, the delayed clock ICLKd is generated by delaying the first internal clock ICLK through the first to N^th clock unit delays 21(1:N). When the second bit SC<2> of the shifting code SC<1:N> is logic high level and the first and third to N^th bits SC<1, 3:N> of the shifting code SC<1:N> are logic low level, the delayed clock ICLKd is generated by delaying the first internal clock ICLK through the second to N^th clock unit delays 21(2:N). When the third bit SC<3> of the shifting code SC<1:N> is logic high level and the first, second and fourth to N^th bits SC<1, 2, 4:N> of the shifting code SC<1:N> are logic low level, the delayed clock ICLKd is generated by delaying the first internal clock ICLK through the third to N^th clock unit delays 21(3:N). When the N^th bit SC<N> of the shifting code SC<1:N> is logic high level and the first to (N−1)^th bits SC<1:N−1> of the shifting code SC<1:N> are logic low level, the delayed clock ICLKd is generated by delaying the first internal clock ICLK through the N^th clock unit delay 21(N).

Referring to FIG. 5, the delay intervals of the delayed clock generation circuit 21 which are set depending on the logic level combination of the shifting code SC<1:N> may be seen.

When the first bit SC<1> of the shifting code SC<1:N> is logic high level and the second to N^th bits SC<2:N> of the shifting code SC<1:N> are logic low level, the delay interval of the delayed clock generation circuit 21 may be set to NUI. UI means the delay interval of each of the first to N^th clock unit delays 21(1:N). NUI means that the delay interval of the delayed clock generation circuit 21 is set to an interval required for the first internal clock ICLK to pass through the first to N^th clock unit delays 21(1:N).

When the second bit SC<2> of the shifting code SC<1:N> is logic high level and the first and third to N^th bits SC<1, 3:N> of the shifting code SC<1:N> are logic low level, the delay interval of the delayed clock generation circuit 21 may be set to (N−1)UI. (N−1)UI means that the delay interval of the delayed clock generation circuit 21 is set to an interval required for the first internal clock ICLK to pass through the second to N^th clock unit delays 21(2:N).

When the third bit SC<3> of the shifting code SC<1:N> is logic high level and the first, second and fourth to N^th bits SC<1, 2, 4:N> of the shifting code SC<1:N> are logic low level, the delay interval of the delayed clock generation circuit 21 may be set to (N−2)UI. (N−2)UI means that the delay interval of the delayed clock generation circuit 21 is set to an interval required for the first internal clock ICLK to pass through the third to N^th clock unit delays 21(3:N).

When the N^th bit SC<N> of the shifting code SC<1:N> is logic high level and the first to (N−1)^th bits SC<1:N−1> of the shifting code SC<1:N> are logic low level, the delay interval of the delayed clock generation circuit 21 may be set to UI. UI means that the delay interval of the delayed clock generation circuit 21 is set to an interval required for the first internal clock ICLK to pass through the N^th clock unit delay 21(N).

Figure 6:
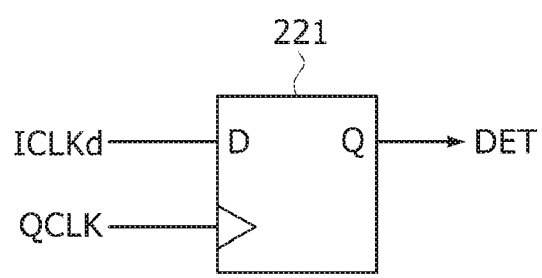
FIG. 6 is a circuit diagram illustrating a representation of an example of the phase detection circuit included in the delay code generation circuit illustrated in FIG. 3.

Referring to FIG. 6, the phase detection circuit 22 may latch the delayed clock ICLKd in synchronization with the second internal clock QCLK, and output the latched delayed clock ICLKd as the detection signal DET. The phase detection circuit 22 may generate the detection signal DET which has a logic high level when the phase of the delayed clock ICLKd is earlier than the phase of the second internal clock QCLK. The phase detection circuit 22 may generate the detection signal DET which has a logic low level when the phase of the delayed clock ICLKd is later than the phase of the second internal clock QCLK. The phase detection circuit 22 may be realized by a D flip-flop 221.

Figure 7:
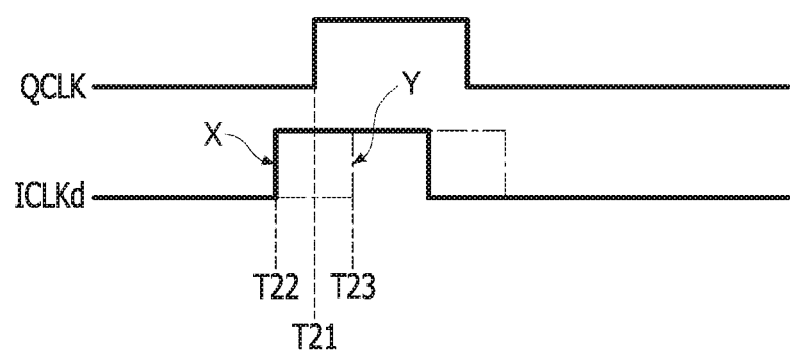
FIG. 7 is a representation of an example of a timing diagram to assist in the explanation of the operation of the phase detection circuit illustrated in FIG. 6.

Referring to FIG. 7, the phase difference of the second internal clock QCLK and the delayed clock ICLKd may be seen. As in X, when the phase of the delayed clock ICLKd is earlier than the phase of the second internal clock QCLK, the detection signal DET of logic high level is generated. As in Y, when the phase of the delayed clock ICLKd is later than the phase of the second internal clock QCLK, the detection signal DET of logic low level is generated.

Figure 8:
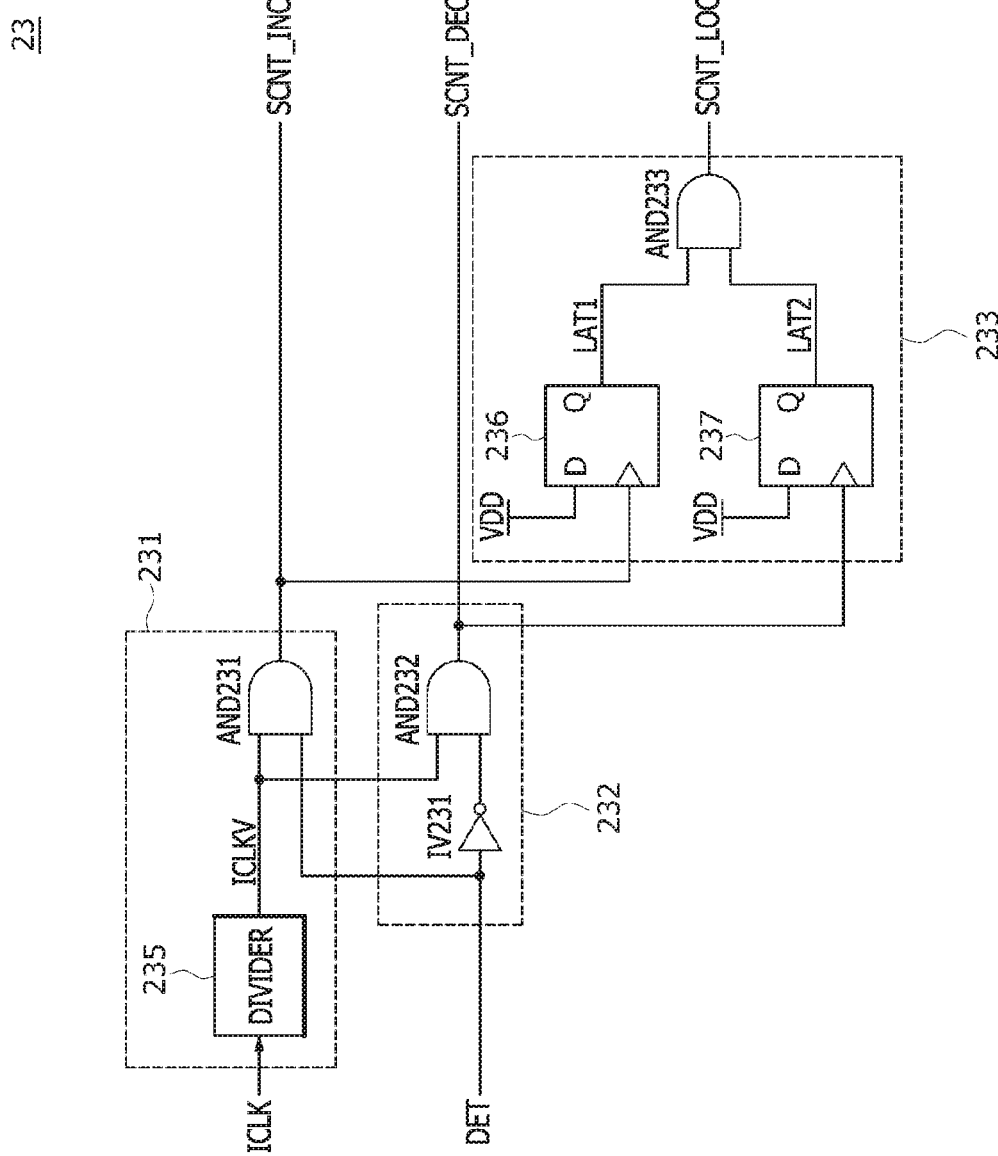
FIG. 8 is a circuit diagram illustrating a representation of an example of the shifting control signal generation circuit included in the delay code generation circuit illustrated in FIG. 3.

Referring to FIG. 8, the shifting control signal generation circuit 23 may include a first shifting control signal generator 231, a second shifting control signal generator 232 and a third shifting control signal generator 233.

The first shifting control signal generator 231 may be configured to perform a dividing operation and an AND operation. For example, the first shifting control signal generator 231 may include a divider 235 and an AND gate AND231. The divider 235 may divide the first internal clock ICLK, and generate the divided clock ICLKV. The cycle of the divided clock ICLKV may be set to K times the cycle of the first internal clock ICLK. K may be set to a natural number. The AND gate AND231 may receive the divided clock ICLKV and the detection signal DET and perform an AND logic operation. The AND gate AND231 may generate the first shifting control signal SCNT_INC which is enabled to logic high level, in synchronization with the rising edge of the divided clock ICLKV in a state in which the detection signal DET is logic high level. The first shifting control signal generator 231 may generate the first shifting control signal SCNT_INC which is enabled to logic high level, in synchronization with the rising edge of the divided clock ICLKV in a state in which the detection signal DET of logic high level is generated as the phase of the delayed clock ICLKd is earlier than the phase of the second internal clock QCLK.

The second shifting control signal generator 232 may be configured to perform an inversion operation and an AND operation. For example, the second shifting control signal generator 232 may include an inverter IV231 and an AND gate AND232. The inverter IV231 may invert and buffer the detection signal DET and output an output signal. The AND gate AND232 may receive the divided clock ICLKV and the output signal of the inverter IV231 and perform an AND logic operation. The AND gate AND232 may generate the second shifting control signal SCNT_DEC which is enabled to logic high level, in synchronization with the rising edge of the divided clock ICLKV in a state in which the detection signal DET is logic low level. The second shifting control signal generator 232 may generate the second shifting control signal SCNT_DEC which is enabled to logic high level, in synchronization with the rising edge of the divided clock ICLKV in a state in which the detection signal DET of logic low level is generated as the phase of the delayed clock ICLKd is later than the phase of the second internal clock QCLK.

The third shifting control signal generator circuit 233 may be configured to perform a first latch operation, a second latch operation, and an AND operation. For example, the third shifting control signal generator 233 may include a first latch signal generation circuit 236, a second latch signal generation circuit 237 and an AND gate AND233. The first latch signal generation circuit 236 may latch the power supply voltage VDD in synchronization with the first shifting control signal SCNT_INC, and output the latched power supply voltage VDD as a first latch signal LAT1. The second latch signal generation circuit 237 may latch the power supply voltage VDD in synchronization with the second shifting control signal SCNT_DEC, and output the latched power supply voltage VDD as a second latch signal LAT2. Each of the first latch signal generation circuit 236 and the second latch signal generation circuit 237 may be realized by a D flip-flop. The AND gate AND233 may receive the first latch signal LAT1 and the second latch signal LAT2 and perform an AND logic operation. The AND gate AND233 may generate the third shifting control signal SCNT_LOCK which is enabled to a logic high level when both the first latch signal LAT1 and the second latch signal LAT2 are logic high level. The third shifting control signal generator 233 may generate the third shifting control signal SCNT_LOCK which is enabled to a logic high level when the first shifting control signal SCNT_INC and the second shifting control signal SCNT_DEC are respectively enabled at least one time to logic high level.

The operation of the shifting control signal generation circuit 23 will be described below with reference to FIGS. 9 and 10.

Figure 9:
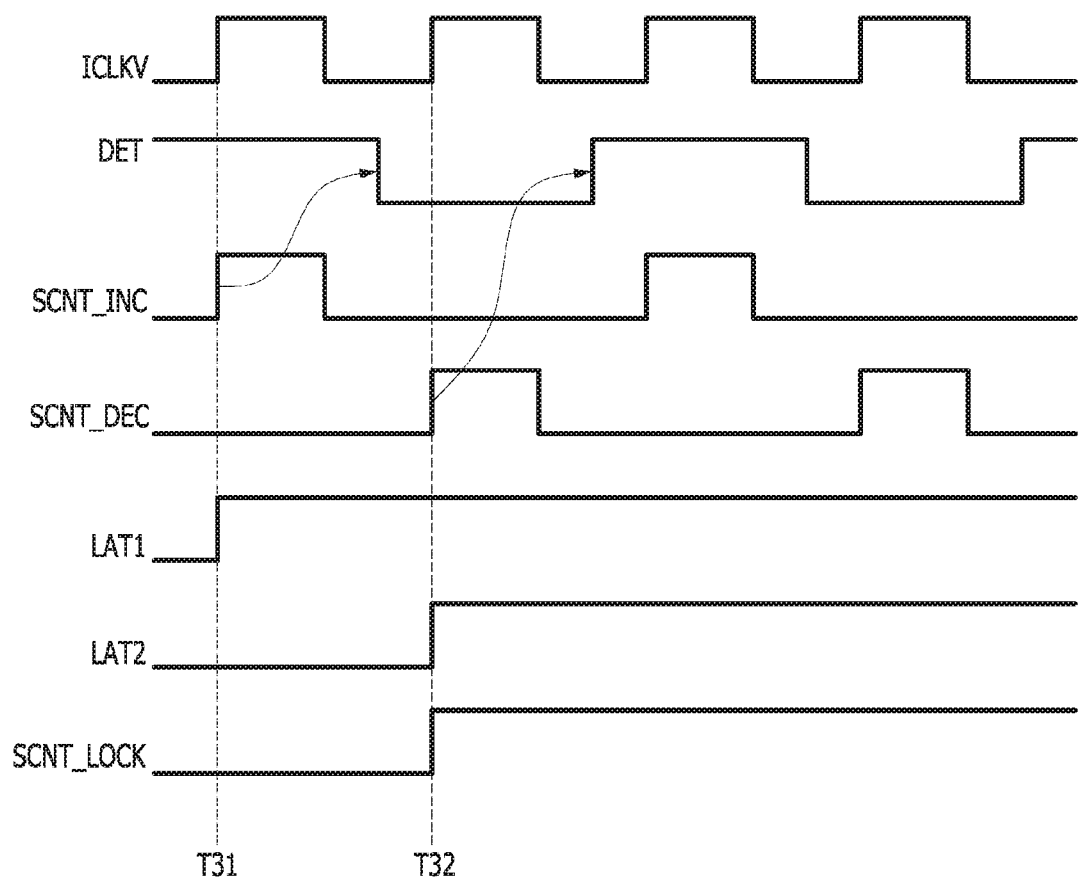
FIGS. 9 and 10 are representations of examples of timing diagrams to assist in the explanation of the operation of the shifting control signal generation circuit illustrated in FIG. 8.

As shown in FIG. 9, at a time T31, in a state in which the detection signal DET is logic high level, the first shifting control signal SCNT_INC is enabled to logic high level in synchronization with the rising edge of the divided clock ICLKV. If the first shifting control signal SCNT_INC is enabled, as the shifting code SC<1:N> is adjusted to increase the delay interval of the delayed clock generation circuit 21, the phase of the delayed clock ICLKd becomes later than the phase of the second internal clock QCLK, and the detection signal DET transitions from logic high level to logic low level. As the first shifting control signal SCNT_INC transitions to logic high level, the first latch signal LAT1 transitions from logic low level to logic high level. At a time T32, in a state in which the detection signal DET is logic low level, the second shifting control signal SCNT_DEC is enabled to logic high level in synchronization with the rising edge of the divided clock ICLKV. If the second shifting control signal SCNT_DEC is enabled, as the shifting code SC<1:N> is adjusted to decrease the delay interval of the delayed clock generation circuit 21, the phase of the delayed clock ICLKd becomes earlier than the phase of the second internal clock QCLK, and the detection signal DET transitions from logic low level to logic high level. As the second shifting control signal SCNT_DEC transitions to logic high level, the second latch signal LAT2 transitions from logic low level to logic high level. When both the first latch signal LAT1 and the second latch signal LAT2 are logic high level at the time T32, the third shifting control signal SCNT_LOCK is enabled to logic high level, and the shifting code SC<1:N> holds a predetermined logic level combination.

The word "predetermined" as used herein with respect to a parameter, such as a predetermined logic level combination, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 10:
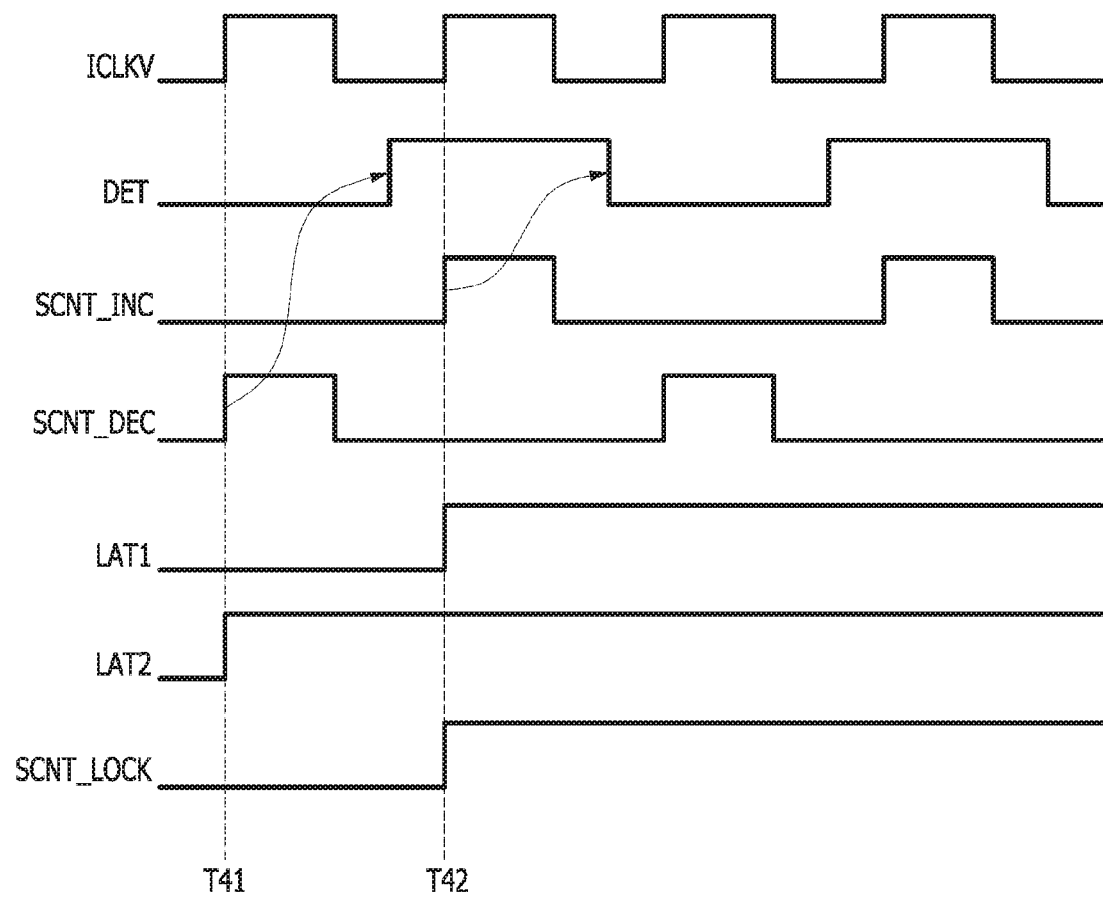

As shown in FIG. 10, at a time T41, in a state in which the detection signal DET is logic low level, the second shifting control signal SCNT_DEC is enabled to logic high level in synchronization with the rising edge of the divided clock ICLKV. If the second shifting control signal SCNT_DEC is enabled, as the shifting code SC<1:N> is adjusted to decrease the delay interval of the delayed clock generation circuit 21, the phase of the delayed clock ICLKd becomes earlier than the phase of the second internal clock QCLK, and the detection signal DET transitions from logic low level to logic high level. As the second shifting control signal SCNT_DEC transitions to logic high level, the second latch signal LAT2 transitions from logic low level to logic high level. At a time T42, in a state in which the detection signal DET is logic high level, the first shifting control signal SCNT_INC is enabled to logic high level in synchronization with the rising edge of the divided clock ICLKV. If the first shifting control signal SCNT_INC is enabled, as the shifting code SC<1:N> is adjusted to increase the delay interval of the delayed clock generation circuit 21, the phase of the delayed clock ICLKd becomes later than the phase of the second internal clock QCLK, and the detection signal DET transitions from logic high level to logic low level. As the first shifting control signal SCNT_INC transitions to logic high level, the first latch signal LAT1 transitions from logic low level to logic high level. When both the first latch signal LAT1 and the second latch signal LAT2 are logic high level at the time T42, the third shifting control signal SCNT_LOCK is enabled to logic high level, and the shifting code SC<1:N> holds a predetermined logic level combination.

Figure 11:
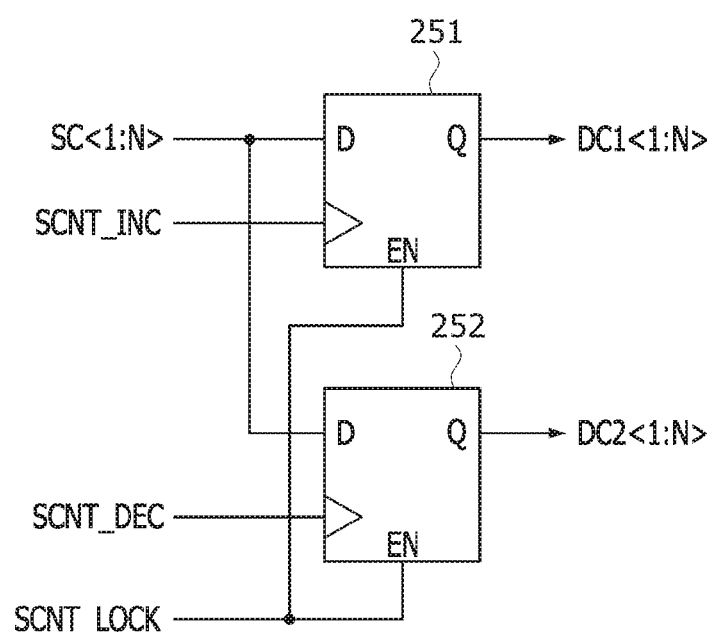
FIG. 11 is a circuit diagram illustrating a representation of an example of the code latch circuit included in the delay code generation circuit illustrated in FIG. 3.

Referring to FIG. 11, the code latch circuit 25 may include a first code latch 251 and a second code latch 252. The first code latch 251 is activated when the third shifting control signal SCNT_LOCK is enabled to logic high level. The first code latch 251 may latch the shifting code SC<1:N> in synchronization with a time at which the first shifting control signal SCNT_INC is enabled to logic high level, and output the latched shifting code SC<1:N> as the first delay code DC1<1:N>. The second code latch 252 is activated when the third shifting control signal SCNT_LOCK is enabled to logic high level. The second code latch 252 may latch the shifting code SC<1:N> in synchronization with a time at which the second shifting control signal SCNT_DEC is enabled to logic high level, and output the latched shifting code SC<1:N> as the second delay code DC2<1:N>. Each of the first code latch 251 and the second code latch 252 may be realized by a D flip-flop.

The code latch circuit 25 may generate the first delay code DC1<1:N> from the shifting code SC<1:N> when the third shifting control signal SCNT_LOCK is enabled and the first shifting control signal SCNT_INC is enabled. The code latch circuit 25 may generate the second delay code DC2<1:N> from the shifting code SC<1:N> when the third shifting control signal SCNT_LOCK is enabled and the second shifting control signal SCNT_DEC is enabled.

The operation of the code latch circuit 25 will be described below with reference to FIGS. 12 and 13.

Figure 12:
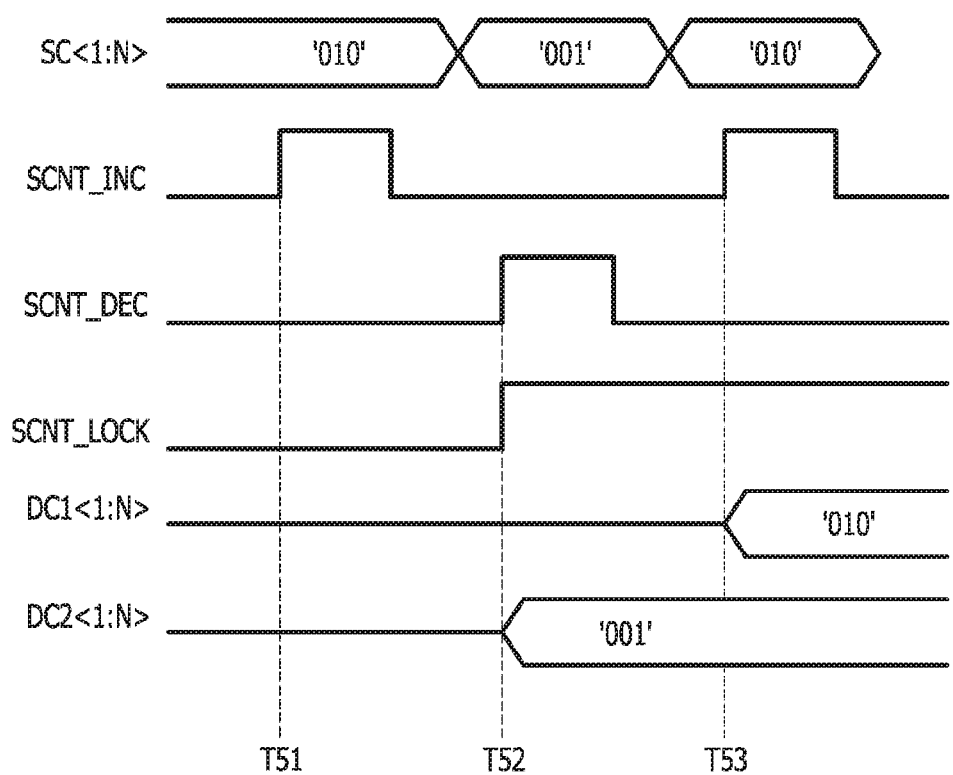
FIGS. 12 and 13 are representations of examples of timing diagrams to assist in the explanation of the operation of the code latch circuit illustrated in FIG. 11.

As shown in FIG. 12, after the first shifting control signal SCNT_INC is enabled to logic high level at a time T51, in order to increase the delay interval of the delayed clock generation circuit 21, the shifting code SC<1:N> is adjusted from '010' to '001.' After the second shifting control signal SCNT_DEC is enabled to logic high level at a time T52, in order to decrease the delay interval of the delayed clock generation circuit 21, the shifting code SC<1:N> is adjusted from '001' to '010.' After the first shifting control signal SCNT_INC is enabled to logic high level at the time T51, at the time T52 when the second shifting control signal SCNT_DEC is enabled to logic high level, the third shifting control signal SCNT_LOCK is enabled to logic high level. At the time T52 when the third shifting control signal SCNT_LOCK is enabled to logic high level and the second shifting control signal SCNT_DEC is generated, the shifting code SC<1:N> may be outputted as the second delay code DC2<1:N>. The second delay code DC2<1:N> may be set to '001.' At a time T53 when the third shifting control signal SCNT_LOCK is enabled to logic high level and the first shifting control signal SCNT_INC is generated, the shifting code SC<1:N> may be outputted as the first delay code DC1<1:N>. The first delay code DC1<1:N> may be set to '010.'

Figure 13:
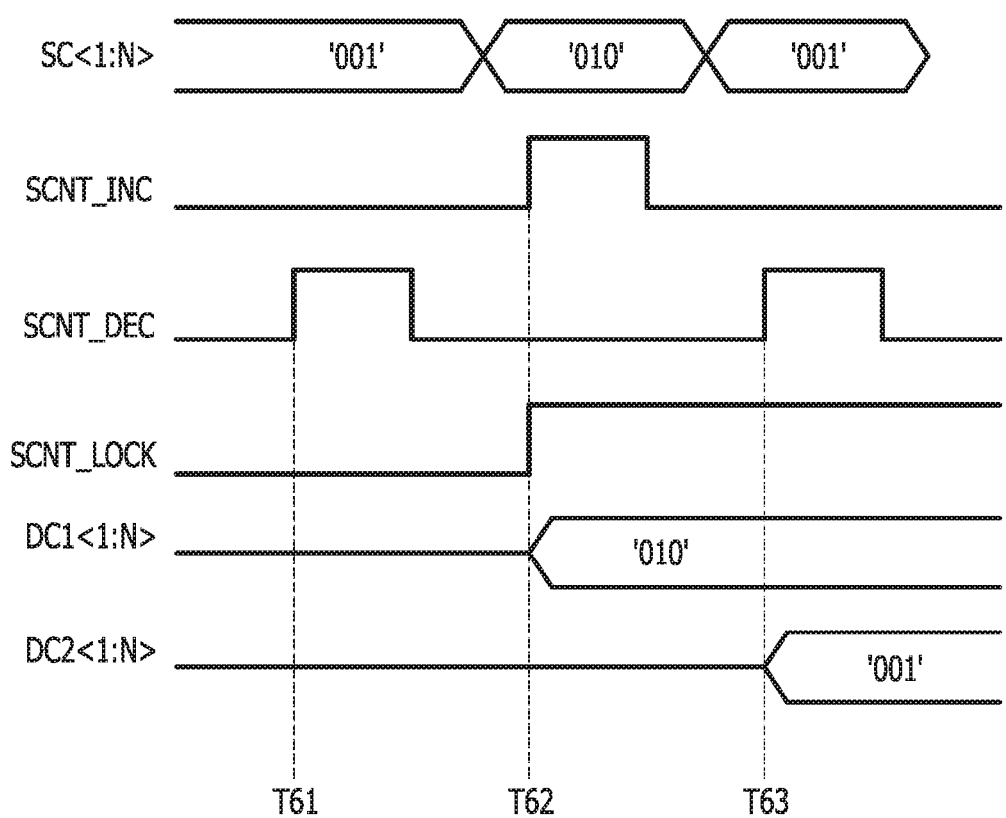

As shown in FIG. 13, after the second shifting control signal SCNT_DEC is enabled to logic high level at a time T61, in order to decrease the delay interval of the delayed clock generation circuit 21, the shifting code SC<1:N> is adjusted from '001' to '010.' After the first shifting control signal SCNT_INC is enabled to logic high level at a time T62, in order to increase the delay interval of the delayed clock generation circuit 21, the shifting code SC<1:N> is adjusted from '010' to '001.' After the second shifting control signal SCNT_DEC is enabled to logic high level at the time T61, at the time T62 when the first shifting control signal SCNT_INC is enabled to logic high level, the third shifting control signal SCNT_LOCK is enabled to logic high level. At the time T62 when the third shifting control signal SCNT_LOCK is enabled to logic high level and the first shifting control signal SCNT_INC is generated, the shifting code SC<1:N> may be outputted as the first delay code DC1<1:N>. The first delay code DC1<1:N> may be set to '010.' At a time T63 when the third shifting control signal SCNT_LOCK is enabled to logic high level and the second shifting control signal SCNT_DEC is generated, the shifting code SC<1:N> may be outputted as the second delay code DC2<1:N>. The second delay code DC2<1:N> may be set to '001.'

Figure 14:
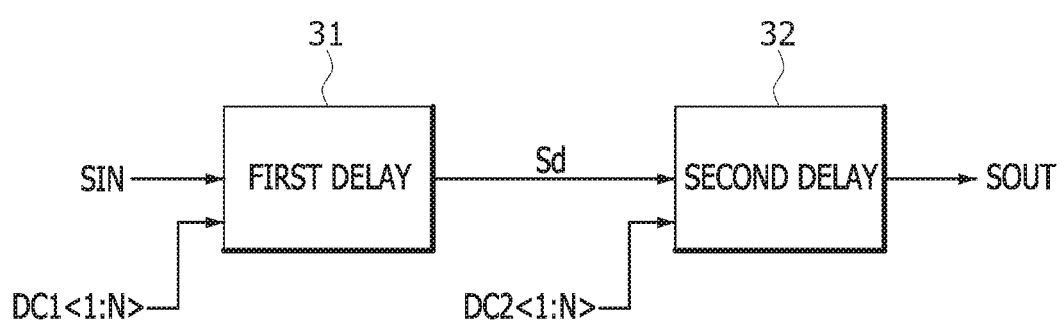
FIG. 14 is a block diagram illustrating a representation of an example of the configuration of the delay circuit included in the semiconductor device illustrated in FIG. 1.

Referring to FIG. 14, the delay circuit 3 may include the first delay 31 and the second delay 32. The first delay 31 may delay the input signal SIN based on the first delay code DC1<1:N> and generate a delayed signal Sd. The second delay 32 may delay the delayed signal Sd based on the second delay code DC2<1:N> and generate the output signal SOUT. Hereinbelow, a configuration and an operation for delaying the input signal SIN based on the first delay code DC1<1:N> and generating the delayed signal Sd will be described with reference to FIG. 15, and a configuration and an operation for delaying the delayed signal Sd based on the second delay code DC2<1:N> and generating the output signal SOUT will be described with reference to FIG. 16.

Figure 15:
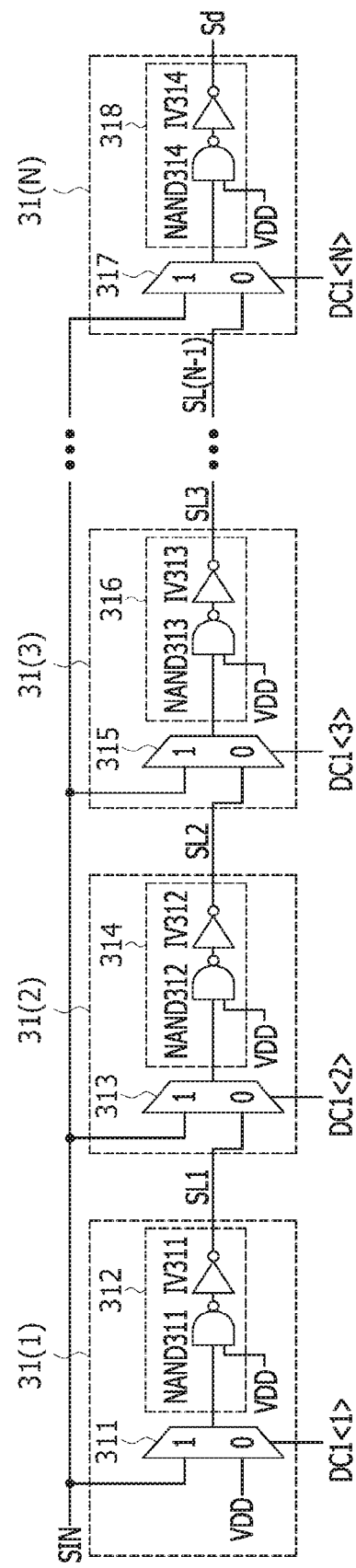
FIG. 15 is a circuit diagram illustrating a representation of an example of the first delay included in the delay circuit illustrated in FIG. 14.

As shown in FIG. 15, the first delay 31 may include first to N^th selective unit delays 31(1:N).

The first selective unit delay 31(1) may include a first selector 311 and a first outputter 312. The first selector 311 may selectively output the input signal SIN or the power supply voltage VDD based on the first bit DC1<1> of the first delay code DC1<1:N>. The first outputter 312 may be configured to perform a NAND operation and an inversion operation. For example, the first outputter 312 may include a NAND gate NAND311 and an inverter IV311. The NAND gate NAND311 may receive the output signal of the first selector 311 and the power supply voltage VDD and perform a NAND logic operation. The inverter IV311 may invert and buffer the output signal of the NAND gate NAND311, and output a first selection signal SL1. The first outputter 312 may buffer the output signal of the first selector 311 and generate the first selection signal SL1.

The second selective unit delay 31(2) may include a second selector 313 and a second outputter 314. The second selector 313 may selectively output the input signal SIN or the first selection signal SL1 based on the second bit DC1<2> of the first delay code DC1<1:N>. The second outputter 314 may be configured to perform a NAND operation and an inversion operation. For example, the second outputter 314 may include a NAND gate NAND312 and an inverter IV312. The NAND gate NAND312 may receive the output signal of the second selector 313 and the power supply voltage VDD and perform a NAND logic operation. The inverter IV312 may invert and buffer the output signal of the NAND gate NAND312, and output a second selection signal SL2. The second outputter 314 may buffer the output signal of the second selector 313 and generate the second selection signal SL2.

The third selective unit delay 31(3) may include a third selector 315 and a third outputter 316. The third selector 315 may selectively output the input signal SIN or the second selection signal SL2 based on the third bit DC1<3> of the first delay code DC1<1:N>. The third outputter 316 may be configured to perform a NAND operation and an inversion operation. For example, the third outputter 316 may include a NAND gate NAND313 and an inverter IV313. The NAND gate NAND313 may receive the output signal of the third selector 315 and the power supply voltage VDD and perform a NAND logic operation. The inverter IV313 may invert and buffer the output signal of the NAND gate NAND313, and output a third selection signal SL3. The third outputter 316 may buffer the output signal of the third selector 315 and generate the third selection signal SL3.

The N^th selective unit delay 31(N) may include an N^th selector 317 and an N^th outputter 318. The N^th selector 317 may selectively output the input signal SIN or an (N-1)^th selection signal SL(N-1) based on the N^th bit DC1<N> of the first delay code DC1<1:N>. The N^th outputter 318 may be configured to perform a NAND operation and an inversion operation. For example, the N^th outputter 318 may include a NAND gate NAND314 and an inverter IV314. The NAND gate NAND314 may receive the output signal of the N^th selector 317 and the power supply voltage VDD and perform a NAND logic operation. The inverter IV314 may invert and buffer the output signal of the NAND gate NAND314, and output the delayed signal Sd. The N^th outputter 318 may buffer the output signal of the N^th selector 317 and generate the delayed signal Sd.

When the first bit DC1<1> of the first delay code DC1<1:N> is logic high level and the second to N^th bits DC1<2:N> of the first delay code DC1<1:N> are logic low level, the delayed signal Sd is generated by delaying the input signal SIN through the first to N^th selective unit delays 31(1:N). When the second bit DC1<2> of the first delay code DC1<1:N> is logic high level and the first and third to N^th bits DC1<1, 3:N> of the first delay code DC1<1:N> are logic low level, the delayed signal Sd is generated by delaying the input signal SIN through the second to N^th selective unit delays 31(2:N). When the third bit DC1<3> of the first delay code DC1<1:N> is logic high level and the first, second and fourth to N^th bits DC1<1, 2, 4:N> of the first delay code DC1<1:N> are logic low level, the delayed signal Sd is generated by delaying the input signal SIN through the third to N^th selective unit delays 31(3:N). When the N^th bit DC1<N> of the first delay code DC1<1: N> is logic high level and the first to (N-1)^th bits DC1<1: N-1> of the first delay code DC1<1:N> are logic low level, the delayed signal Sd is generated by delaying the input signal SIN through the N^th selective unit delay 31(N).

Figure 16:
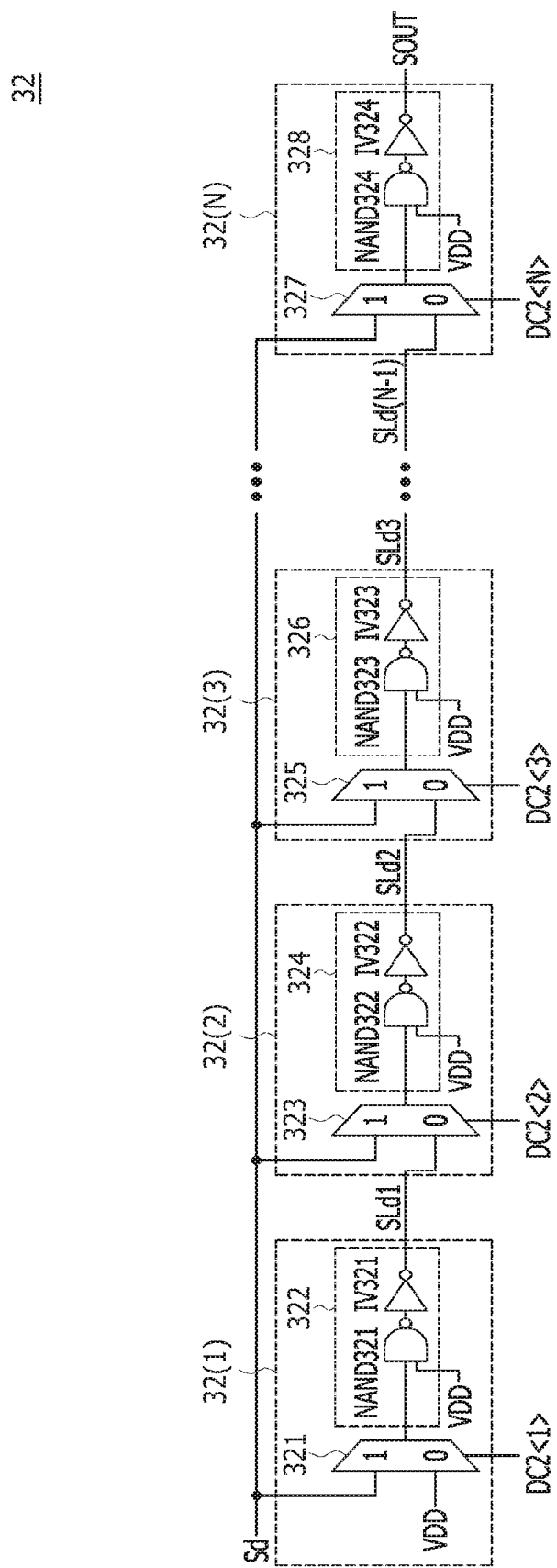
FIG. 16 is a circuit diagram illustrating a representation of an example of the second delay included in the delay circuit illustrated in FIG. 14.

As shown in FIG. 16, the second delay 32 may include first to N^th delay selective unit delays 32(1:N).

The first delay selective unit delay 32(1) may include a first delay selector 321 and a first delay outputter 322. The first delay selector 321 may selectively output the delayed signal Sd or the power supply voltage VDD based on the first bit DC2<1> of the second delay code DC2<1:N>. The first delay outputter 322 may include a NAND gate NAND321 and an inverter IV321. The NAND gate NAND321 may receive the output signal of the first delay selector 321 and the power supply voltage VDD and perform a NAND logic operation. The inverter IV321 may invert and buffer the output signal of the NAND gate NAND321, and output a first delay selection signal SLd1. The first delay outputter 322 may buffer the output signal of the first delay selector 321 and generate the first delay selection signal SLd1.

The second delay selective unit delay 32(2) may include a second delay selector 323 and a second delay outputter 324. The second delay selector 323 may selectively output the delayed signal Sd or the first delay selection signal SLd1 based on the second bit DC2<2> of the second delay code DC2<1:N>. The second delay outputter 324 may include a NAND gate NAND322 and an inverter IV322. The NAND gate NAND322 may receive the output signal of the second delay selector 323 and the power supply voltage VDD and perform a NAND logic operation. The inverter IV322 may invert and buffer the output signal of the NAND gate NAND322, and output a second delay selection signal SLd2. The second delay outputter 324 may buffer the output signal of the second delay selector 323 and generate the second delay selection signal SLd2.

The third delay selective unit delay 32(3) may include a third delay selector 325 and a third delay outputter 326. The third delay selector 325 may selectively output the delayed signal Sd or the second delay selection signal SLd2 based on the third bit DC2<3> of the second delay code DC2<1:N>. The third delay outputter 326 may include a NAND gate NAND323 and an inverter IV323. The NAND gate NAND323 may receive the output signal of the third delay selector 325 and the power supply voltage VDD and perform a NAND logic operation. The inverter IV323 may invert and buffer the output signal of the NAND gate NAND323, and output a third delay selection signal SLd3. The third delay outputter 326 may buffer the output signal of the third delay selector 325 and generate the third delay selection signal SLd3.

The N^th delay selective unit delay 32(N) may include an N^th delay selector 327 and an N^th delay outputter 328. The N^th delay selector 327 may selectively output the delayed signal Sd or an (N-1)^th delay selection signal SLd(N-1) based on the N^th bit DC2<N> of the second delay code DC2<1:N>. The N^th delay outputter 328 may include a NAND gate NAND324 and an inverter IV324. The NAND gate NAND324 may receive the output signal of the N^th delay selector 327 and the power supply voltage VDD and perform a NAND logic operation. The inverter IV324 may invert and buffer the output signal of the NAND gate NAND324, and output the output signal SOUT. The N^th delay outputter 328 may buffer the output signal of the N^th delay selector 327 and generate the output signal SOUT.

When the first bit DC2<1> of the second delay code DC2<1:N> is logic high level and the second to N^th bits DC2<2:N> of the second delay code DC2<1:N> are logic low level, the output signal SOUT is generated by delaying the delayed signal Sd through the first to N^th delay selective unit delays 32(1:N). When the second bit DC2<2> of the second delay code DC2<1:N> is logic high level and the first and third to N^th bits DC2<1, 3:N> of the second delay code DC2<1:N> are logic low level, the output signal SOUT is generated by delaying the delayed signal Sd through the second to N^th delay selective unit delays 32(2:N). When the third bit DC2<3> of the second delay code DC2<1:N> is logic high level and the first, second and fourth to N^th bits DC2<1, 2, 4:N> of the second delay code DC2<1:N> are logic low level, the output signal SOUT is generated by delaying the delayed signal Sd through the third to N^th delay selective unit delays 32(3:N). When the N^th bit DC2<N> of the second delay code DC2<1:N> is logic high level and the first to (N-1)^th bits DC2<1:N-1> of the second delay code DC2<1:N> are logic low level, the output signal SOUT is generated by delaying the delayed signal Sd through the N^th delay selective unit delay 32(N).

The above-described delay circuit 3 included in the semiconductor device in accordance with the embodiment includes the first delay 31 which is adjusted in a delay interval by the first delay code DC1<1:N> generated when the phase of the delayed clock ICLKd is earlier than the phase of the second internal clock QCLK, and the second delay 32 which is adjusted in a delay interval by the second delay code DC2<1:N> generated when the phase of the delayed clock ICLKd is later than the phase of the second internal clock QCLK. Errors that occur in the delay interval of the first delay 31 and in the delay interval of the second delay 32 due to a variation in PVT may be offset to some extend with each other. Therefore, the delay circuit 3 in accordance with the embodiment may decrease an error occurred in a delay interval due to a variation in PVT.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
    a delay code generation circuit configured to generate a shifting code from a first input internal clock, by comparing phases of a second input internal clock and a delayed clock, the delayed clock generated by delaying the first input internal clock, and configured to generate a first delay code and a second delay code from the shifting code; and
    a delay circuit coupled to said delay code generation circuit and configured to generate an output signal by delaying an input signal by a delay interval that is set by the first delay code and the second delay code.

2. The semiconductor device according to claim 1, wherein the first input internal clock and the second input internal clock are generated by dividing a clock, and a phase of the second input internal clock is set to be 90 degrees later than a phase of the first input internal clock.

3. The semiconductor device according to claim 1, wherein the delay code generation circuit adjusts the shifting code to increase a delay interval of the first input internal clock when the phase of the delayed clock is earlier than the phase of the second input internal clock.

4. The semiconductor device according to claim 1, wherein the delay code generation circuit outputs the shifting code as the first delay code when the phase of the delayed clock is earlier than the phase of the second input internal clock.

5. The semiconductor device according to claim 1, wherein the delay code generation circuit adjusts the shifting code to decrease a delay interval of the first input internal clock when the phase of the delayed clock is later than the phase of the second input internal clock.

6. The semiconductor device according to claim 1, wherein the delay code generation circuit outputs the shifting code as the second delay code when the phase of the delayed clock is later than the phase of the second input internal clock.

7. The semiconductor device according to claim 1, wherein the delay code generation circuit comprises:
    a delayed clock generation circuit configured to generate the delayed clock by delaying the first input internal clock by a delay interval adjusted by the shifting code.

8. The semiconductor device according to claim 7, wherein the delayed clock generation circuit comprises a plurality of clock unit delays and generates the delayed clock by delaying the first input internal clock through a combination of clock unit delays, among the plurality of clock unit delays, which are selected depending on a logic level combination of bits included in the shifting code.

9. The semiconductor device according to claim 1, wherein the delay code generation circuit comprises:
    a phase detection circuit configured to generate a detection signal by comparing the phases of the delayed clock and the second input internal clock; and
    a shifting control signal generation circuit configured to generate shifting control signals for adjusting the shifting code, based on the first input internal clock and the detection signal.

10. The semiconductor device according to claim 9, wherein the phase detection circuit generates the detection signal with a first logic level when the phase of the delayed clock is earlier than the phase of the second input internal clock, and generates the detection signal with a second logic level when the phase of the delayed clock is later than the phase of the second input internal clock.

11. The semiconductor device according to claim 10, wherein the shifting control signals comprise first to third shifting control signals, and the shifting control signal generation circuit enables the first shifting control signal for adjusting the shifting code to increase a delay interval of the first input internal clock when the detection signal has the first logic level.

12. The semiconductor device according to claim 10, wherein the shifting control signal generation circuit enables the second shifting control signal for adjusting the shifting code to decrease a delay interval of the first input internal clock when the detection signal has the second logic level.

13. The semiconductor device according to claim 10, wherein the shifting control signal generation circuit enables the third shifting control signal when the first shifting control signal and the second shifting control signal are each enabled at least one time.

14. The semiconductor device according to claim 1, wherein the delay circuit comprises:
    a first delay configured to generate a delayed signal by delaying the input signal by a first delay interval adjusted by the first delay code; and a second delay configured to generate the output signal by delaying the delayed signal by a second delay interval adjusted by the second delay code.

15. The semiconductor device according to claim 14, wherein the first delay comprises a plurality of first selective unit delays, and generates the delayed signal by delaying the input signal through a combination of first selective unit delays among the plurality of first selective unit delays, which are selected depending on a logic level combination of bits included in the first delay code.

16. The semiconductor device according to claim 15, wherein the second delay comprises a plurality of second selective unit delays, and generates the output signal by delaying the delayed signal through a combination of second selective unit delays among the plurality of second selective unit delays, which are selected depending on a logic level combination of bits included in the second delay code.

* * * * *